US006841864B2

(12) United States Patent
Hirayama (10) Patent No.: US 6,841,864 B2
(45) Date of Patent: Jan. 11, 2005

(54) SEMICONDUCTOR INTEGRATED CIRCUIT DEVICE, MOUNTING BOARD, AND DEVICE AND BOARD ASSEMBLY

(75) Inventor: Takeshi Hirayama, Osaka (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 0 days.

(21) Appl. No.: 10/188,083

(22) Filed: Jul. 3, 2002

(65) Prior Publication Data

US 2003/0006498 A1 Jan. 9, 2003

(30) Foreign Application Priority Data

Jul. 5, 2001 (JP) .......................................... 2001-204659

(51) Int. Cl.$^7$ .............................................. H01L 27/10
(52) U.S. Cl. ........................ 257/691; 257/692; 257/773
(58) Field of Search ................................ 257/691, 692, 257/773, 784, 786, 207, 208

(56) References Cited

U.S. PATENT DOCUMENTS

| | | | | |
|---|---|---|---|---|
| 5,260,234 | A | * | 11/1993 | Long ........................... 438/121 |
| 6,448,636 | B2 | * | 9/2002 | Suenaga et al. ............ 257/678 |
| 6,469,356 | B2 | * | 10/2002 | Kumagai et al. ........... 257/369 |
| 6,472,745 | B1 | * | 10/2002 | Iizuka ......................... 257/723 |
| 6,525,916 | B2 | * | 2/2003 | Marino et al. ................ 361/58 |

FOREIGN PATENT DOCUMENTS

JP      2-280359      11/1990

OTHER PUBLICATIONS

Harper, Electronic Packaging Interconnection Handbook, 1991, McGraw–Hill, 8.1–8.2.*

* cited by examiner

Primary Examiner—Nathan J. Flynn
Assistant Examiner—Leonardo Andújar
(74) Attorney, Agent, or Firm—McDermott Will & Emery LLP (57) ABSTRACT

A semiconductor integrated circuit device according to the present invention comprises, a semiconductor chip formed with a semiconductor integrated circuit, at least one pair of previous-stage power supply terminals provided on the semiconductor chip and connected to a power supply line, a plurality of pairs of subsequent-stage power supply terminals provided on the semiconductor chip and connected to the power supply line connected commonly to the at least one pair of previous-stage power supply terminals, at least one previous-stage line providing a connection between the at least one pair of previous-stage power supply terminals, and subsequent-stage lines equal in number to the plurality of pairs of subsequent-stage power supply terminals and each providing a connection between the corresponding one of the plurality of pairs of subsequent-stage power supply terminals, wherein the at least one pair of previous-stage power supply terminals and the plurality of pairs of subsequent-stage power supply terminals are connected to each other to form a closed circuit when they are mounted on a mounting board.

6 Claims, 4 Drawing Sheets

SEMICONDUCTOR INTEGRATED CIRCUIT DEVICE, MOUNTING BOARD, AND DEVICE AND BOARD ASSEMBLY

BACKGROUND OF THE INVENTION

The present invention relates to a semiconductor integrated circuit device and to a mounting board. More particularly, it relates to a semiconductor integrated circuit device with improved reliability.

A mounting board for mounting thereon a semiconductor integrated circuit device having a plurality of power supply terminals and a plurality of signal terminals is used to supply a power supply voltage to the semiconductor integrated circuit device and perform signal input/output operations between the semiconductor integrated circuit device and the outside. Referring to the drawings, a conventional mounting board for mounting thereon a semiconductor integrated circuit device having a plurality of power supply terminals and a plurality of signal terminals will be described herein below.

Figure 4:
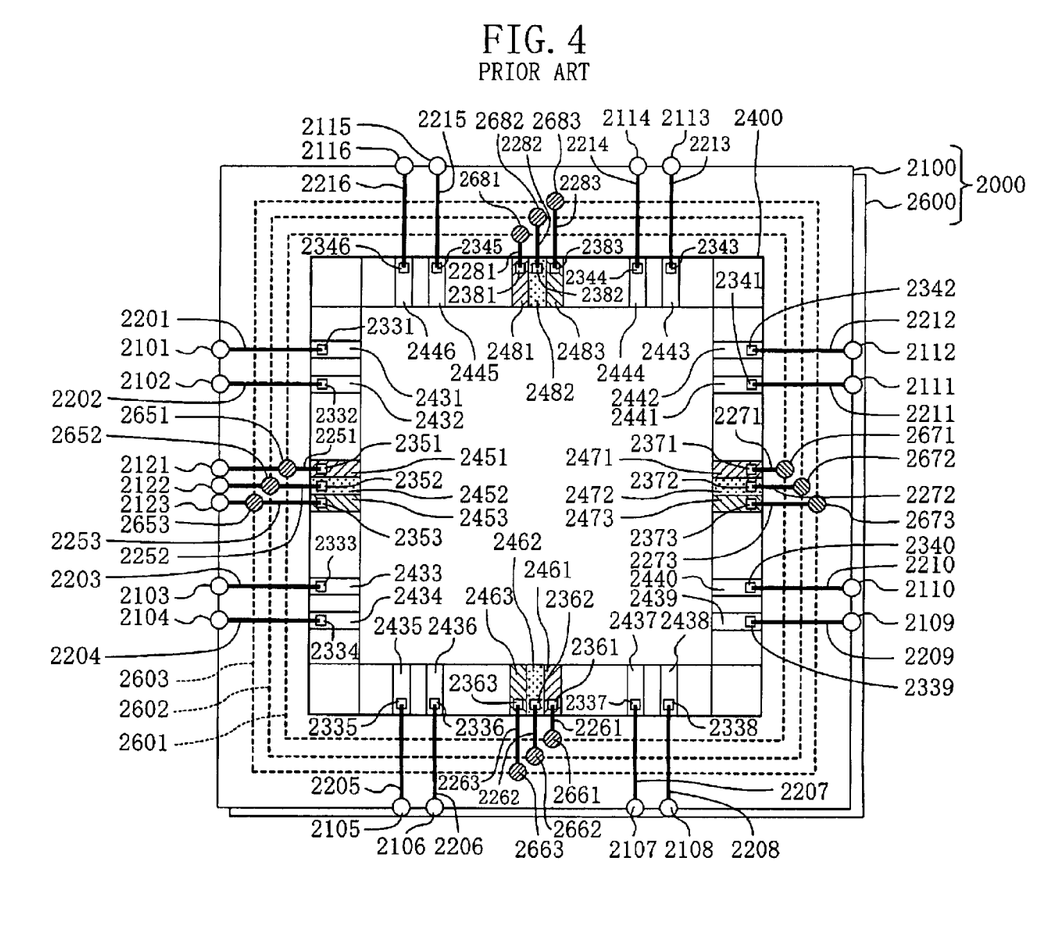
FIG. 4 shows a structure of a conventional mounting board for mounting thereon a semiconductor integrated circuit device.

FIG. 4 shows a structure of the conventional mounting board for mounting thereon the semiconductor integrated circuit device.

As shown in FIG. 4, a semiconductor integrated circuit device 2400 is mounted on a mounting board 2000 composed of a first-layer sub-board 2100 and a second-layer sub-board 2600. The first-layer sub-board 2100 is disposed on the second-layer sub-board 2600.

The semiconductor integrated circuit device 2400 comprises: signal terminal cells 2431 to 2446 formed on the semiconductor integrated circuit device; and power supply terminal cells 2451 to 2453, 2461 to 2463, 2471 to 2473, and 2481 to 2483 formed on the individual edge portion portions of the semiconductor integrated circuit device.

The signal terminal cells 2431 to 2446 are formed with respective signal terminal electrodes 2331 to 2346 for performing signal input/output operations between the semiconductor integrated circuit device 2400 and the outside.

The power supply terminal cells 2451 to 2453, 2461 to 2463, 2471 to 2473, and 2481 to 2483 are formed with respective power supply electrodes 2351 to 2353, 2361 to 2363, 2371 to 2373, and 2381 to 2383 for supplying the power supply voltage to the inside of the semiconductor integrated circuit device 2400.

The sub-board 2100 is provided with: input/output terminals 2101 to 2116; power supply terminals 2121 to 2123; signal lines 2201 to 2216; power supply lines 2251 to 2253; and power supply lines 2261 to 2263, 2271 to 2273, and 2281 to 2283. The input/output terminals 2101 to 2116 and the signal terminal electrodes 2331 to 2346 placed on the semiconductor integrated circuit device 2400 are connected to each other by the signal lines 2201 to 2216.

The power supply terminals 2121 to 2123 and the power supply electrodes 2351 to 2353 provided in the semiconductor integrated circuit device 2400 are connected to each other by the power supply lines 2251 to 2253. Between the power supply terminals 2121 to 2123 and the power supply electrodes 2351 to 2353, the power supply lines 2251 to 2253 are branched to be connected also to contact lines 2651 to 2653, respectively.

The electrodes 2361 to 2363, 2371 to 2373, and 2381 to 2383 on the semiconductor integrated circuit device 2400 are connected to contact lines 2661 to 2663, 2671 to 2673, and 2681 to 2683 by the power supply lines 2261 to 2263, 2271 to 2273, and 2281 to 2283, respectively.

The sub-board 2600 comprises power supply lines 2601 to 2603. The power supply line 2601 is connected to the power supply lines 2251, 2261, 2271, and 2281 on the sub-board 2100 via the contact lines 2651, 2661, 2671, and 2681, respectively.

Likewise, the power supply line 2602 is connected to the power supply lines 2252, 2262, 2272, and 2282 on the sub-board 2100 via the contact lines 2652, 2662, 2672, and 2682, respectively.

The power supply line 2603 is also connected to the power supply lines 2253, 2263, 2273, and 2283 on the sub-board 2100 via the contact lines 2653, 2663, 2673, and 2683, respectively.

A description will be given to the operation of the mounting board 2000 thus constructed.

If signals are inputted from the signal terminals 2101 to 2116, the signals are inputted to the electrodes 2331 to 2346 of the semiconductor integrated circuit device 2400 through the signal lines 2201 to 2216 formed on the sub-board 2100, respectively. Conversely, signals outputted from the semiconductor integrated circuit device 2400 are outputted from the electrodes 2331 to 2346 to the signal terminals 2101 to 2116 through the signal lines 2201 to 2216. In short, the signals are outputted by a route absolutely opposite to the route for the input signals.

A description will be given next to the supply of the power supply voltage.

The power supply voltage supplied from the power supply terminal 2121 is supplied to the electrode 2351 of the semiconductor integrated circuit device 2400 through the line 2251 formed on the sub-board 2100. Subsequently, the power supply voltage is supplied to the inside of the semiconductor integrated circuit device 2400 via the power supply terminal cell 2451. At the same time, the power supply voltage supplied from the power supply terminal 2121 is supplied to the power supply electrodes 2361, 2371, and 2381 successively through the power supply line 2251 formed on the sub-board 2100, the contact line 2651, the power supply line 2601 formed on the sub-board 2600, and the contact lines 2661, 2671, and 2681. Subsequently, the power supply voltage is supplied to the inside of the semiconductor integrated circuit device 2400 via the power supply terminal cells 2461, 2471, and 2481.

The power supply voltage supplied from the power supply terminal 2122 is supplied to the electrode 2352 of the semiconductor integrated circuit device 2400 through the line 2252 formed on the sub-board 2100. Subsequently, the power supply voltage is supplied to the inside of the semiconductor integrated circuit device 2400 via the power supply terminal cell 2452. At the same time, the power supply voltage supplied from the power supply terminal 2122 is supplied to the power supply electrodes 2362, 2372, and 2382 successively through the power supply line 2252 formed on the sub-board 2100, the contact line 2652, the power supply line 2602 formed on the sub-board 2600, and the contact lines 2662, 2672, and 2682. Subsequently, the power supply voltage is supplied to the inside of the semiconductor integrated circuit device 2400 via the power supply terminal cells 2462, 2472, and 2482.

The power supply voltage supplied from the power supply terminal 2123 is supplied to the electrode 2353 of the semiconductor integrated circuit device 2400 through the line 2253 formed on the sub-board 2100. Subsequently, the power supply voltage is supplied to the inside of the semiconductor integrated circuit device 2400 via the power supply terminal cell 2453. At the same time, the power supply voltage supplied from the power supply terminal 2123 is supplied to the power supply electrodes 2363, 2373, and 2383 successively through the power supply line 2253 formed on the sub-board 2100, the contact line 2653, the power supply line 2603 formed on the sub-board 2600, and the contact lines 2663, 2673, and 2683. Subsequently, the power supply voltage is supplied to the inside of the semiconductor integrated circuit device 2400 via the power supply terminal cells 2463, 2473, and 2483.

The foregoing conventional structure using the two-layer mounting board composed of the two sub-boards has the problem of increased fabrication cost for the mounting board.

To solve the problem, a method may be adopted which provides the semiconductor integrated circuit device 2400 with, e.g., only the power supply terminal cells 2451 to 2453 of the power supply terminals cells that have been provided conventionally on the four edge portions and supplies the power supply voltage to the entire semiconductor integrated circuit device 2400 from the inside thereof. If the power supply voltage is supplied to the entire semiconductor integrated circuit device 2400 from the inside thereof, however, there are cases where the semiconductor integrated circuit device 2400 does not operate normally due to a voltage drop or the like which prevents a sufficient current from being supplied to an end of the circuit. This leads to the conclusion that, since a current supplying ability which tends to be insufficient may cause the malfunctioning of the semiconductor integrated circuit device 2400, the foregoing method is impractical.

SUMMARY OF THE INVENTION

The present invention has been achieved to solve the foregoing problems and it is therefore an object of the present invention to provide a mounting board which is low in fabrication cost and a semiconductor integrated circuit device to be mounted on the mounting board.

A semiconductor integrated circuit device according to the present invention comprises: a semiconductor chip formed with a semiconductor integrated circuit; at least one pair of previous-stage power supply terminals provided on the semiconductor chip and connected to a power supply line; a plurality of pairs of subsequent-stage power supply terminals provided on the semiconductor chip and connected to the power supply line connected commonly to the at least one pair of previous-stage power supply terminals; at least one previous-stage line providing a connection between the at least one pair of previous-stage power supply terminals; and subsequent-stage lines equal in number to the plurality of pairs of subsequent-stage power supply terminals and each providing a connection between the corresponding one of the plurality of pairs of subsequent-stage power supply terminals, the at least one pair of previous-stage power supply terminals and the plurality of pairs of subsequent-stage power supply terminals being connected to each other to form a closed circuit when they are mounted on a mounting board.

According to the present invention, the at least one pair of previous-stage power supply terminals and the plurality of pairs of subsequent-stage power supply terminals form the closed circuit when they are mounted on the mounting board. In the semiconductor integrated circuit device, therefore, the power supply terminals forming each of the pairs are at equal potentials. Consequently, a sufficient power supply voltage is supplied from each of the pairs of power supply terminals to the entire semiconductor integrated circuit device.

Preferably, each of the previous-stage and subsequent-stage lines is composed of a material lower in electric resistance than a material composing the pairs of previous-stage and subsequent-stage power supply terminals.

This minimizes a voltage drop in at least one of the previous-stage and subsequent-stage lines.

The semiconductor integrated circuit device may further comprise: a previous-stage center power supply terminal disposed between the at least one pair of previous-stage power supply terminals and connected to a power supply line other than the foregoing power supply line; and a plurality of subsequent-stage center power supply terminals each disposed between the corresponding one of the plurality of pairs of subsequent-stage power supply terminals and connected to the power supply line connected commonly to the previous-stage center power supply terminal, the previous-stage center power supply terminal and the plurality of subsequent-stage center power supply terminals being connected to each other when they are mounted on the mounting board.

Preferably, the pairs of previous-stage and subsequent-stage power supply terminals are positioned such that respective minimum distances are provided between the at least one pair of previous-stage power supply terminals and between each of the plurality of pairs of subsequent-stage power supply terminals.

This minimizes a voltage drop in at least one of the lines providing connections between the previous-stage power supply terminals and between the subsequent-stage power supply terminals when the semiconductor integrated circuit device is mounted on the mounting board.

The previous-stage center power supply terminal may be connected to a first power supply line, the at least one pair of previous-stage power supply terminals may be composed of a plurality of second to N-th pairs connected to second to N-th power supply lines, and the plurality of pairs of subsequent-stage power supply terminals may be composed of a plurality of second to N-th pairs connected to the second to N-th power supply lines.

The semiconductor integrated circuit device may further comprise: at least one signal terminal provided eternally of the at least one pair of previous-stage power supply terminals or the plurality of pairs of subsequent-stage power supply terminals.

The arrangement achieves separation between a region provided with the signal lines and a region provided with the power supply lines in the semiconductor integrated circuit device and thereby suppresses the degradation of signals and the power supply voltage induced by noise.

A mounting board according to the present invention comprises: a board having a mounting region for mounting thereon a semiconductor integrated circuit device; at least one pair of previous-stage power supply input electrodes disposed within the mounting region and connected to a power supply line; a plurality of pairs of subsequent-stage power supply input electrodes disposed within the mounting region and connected to the power supply line connected commonly to the at least one pair of previous-stage power supply input electrodes; and a line for connecting the at least one pair of previous-stage power supply input electrodes and the plurality of pairs of subsequent-stage power supply input electrodes to each other, the at least one pair of previous-stage power supply input electrodes and the plurality of pairs of subsequent-stage power supply input electrodes being connected to each other to form a closed circuit with the semiconductor integrated circuit device being mounted on the mounting region.

According to the present invention, the at least one pair of previous-stage input electrodes and the plurality of pairs of subsequent-stage power supply terminals form the closed circuit when the semiconductor integrated circuit device is mounted on the mounting board. In the semiconductor integrated circuit device, therefore, power supply terminals in each of pairs connected to the at least one pair of previous-stage power supply input electrodes and to the plurality of pairs of subsequent-stage power supply input electrodes are at equal potentials. What results is a mounting board capable of supplying a sufficient power supply voltage to the entire semiconductor integrated circuit device.

The mounting board may further comprise: a previous-stage center power supply input electrode disposed between the at least one pair of previous-stage power supply input electrodes and connected to a power supply line other than the foregoing power supply line; a plurality of subsequent-stage center input electrodes each disposed between the corresponding one of the plurality of pairs of subsequent-stage power source input electrodes and connected to the power supply line connected commonly to the previous-stage center power supply input electrode; and a line connecting the previous-stage center power supply input electrode and the subsequent-stage center power supply input electrodes to each other.

The previous-stage center power supply input electrode may be connected to a first power supply line, the at least one pair of previous-stage power supply input electrodes may be composed of a plurality of second to N-th pairs connected to second to N-th power supply lines, and the plurality of pairs of subsequent-stage power supply input electrodes may be composed of a plurality of second to N-th pairs connected to the second to N-th power supply lines.

A device and board assembly according to the present invention comprises: a semiconductor integrated circuit device comprising a semiconductor chip formed with a semiconductor integrated circuit, at least one pair of previous-stage power supply terminals provided on the semiconductor chip and connected to a power supply line, a plurality of pairs of subsequent-stage power supply terminals provided on the semiconductor chip and connected to the power supply line connected commonly to the at least one pair of previous-stage power supply terminals, at least one previous-stage line providing a connection between the at least one pair of previous-stage power supply terminals, and subsequent-stage lines equal in number to the plurality of pairs of subsequent-stage power supply terminals and each providing a connection between the corresponding one of the plurality of pairs of subsequent-stage power supply terminals; and a mounting board comprising a board having a mounting region for mounting thereon a semiconductor integrated circuit device, at least one pair of previous-stage power supply input electrodes disposed within the mounting region and connected to the at least one pair of previous-stage power supply terminals, a plurality of pairs of subsequent-stage power supply input electrodes disposed within the mounting region and connected to the plurality of respective pairs of subsequent-stage power supply terminals, and a line for connecting the at least one pair of previous-stage power supply input electrodes and the plurality of pairs of subsequent-stage power supply input electrodes to each other, the semiconductor integrated circuit device being mounted on the mounting region.

According to the present invention, the at least one pair of previous-stage power supply input electrodes and the plurality of pairs of subsequent-stage power supply input electrodes form a closed circuit when the semiconductor integrated circuit device is mounted on the mounting board. In the semiconductor integrated circuit device, therefore, the power supply terminals in each of the pairs connected to the at least one pair of previous-stage power supply input electrodes and to the plurality of pairs of subsequent-stage power supply input electrodes are at equal potentials.

DETAILED DESCRIPTION OF THE INVENTION

Referring to the drawings, an embodiment of the present invention will be described.

Figure 1:
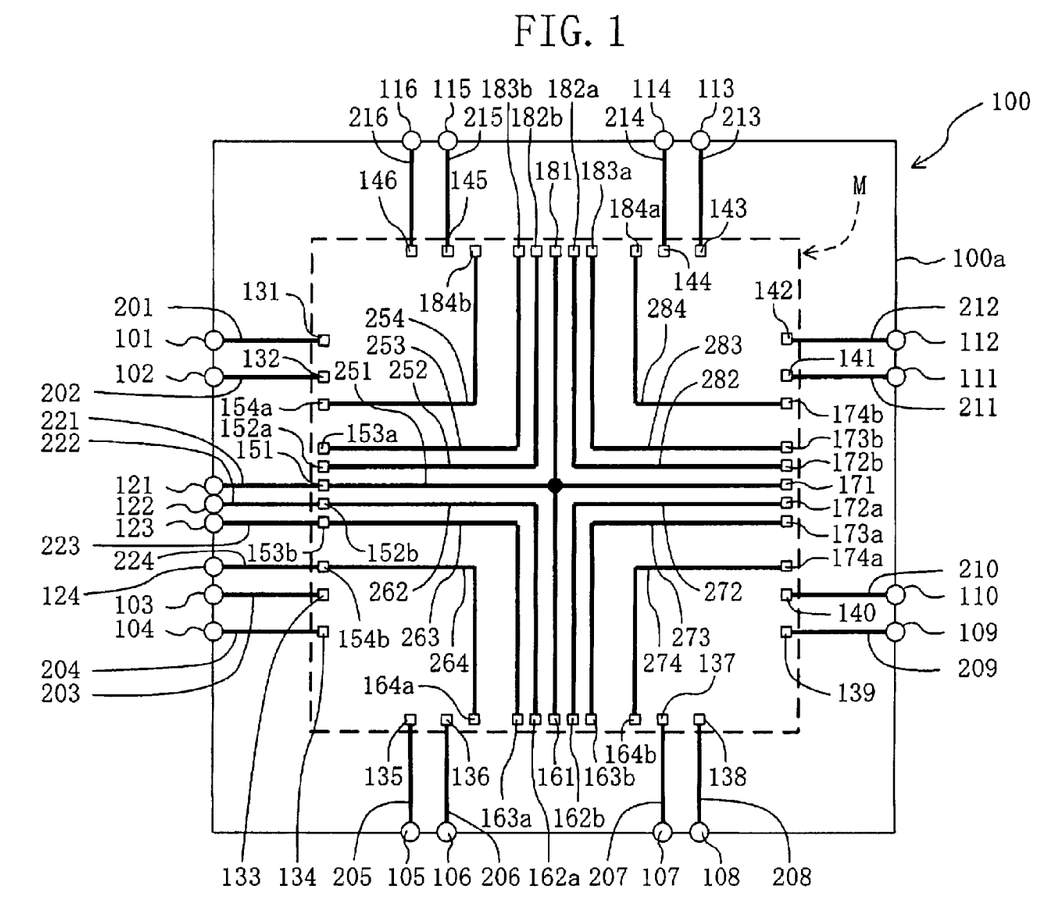
FIG. 1 shows a mounting board according to an embodiment of the present invention.
Figure 2:
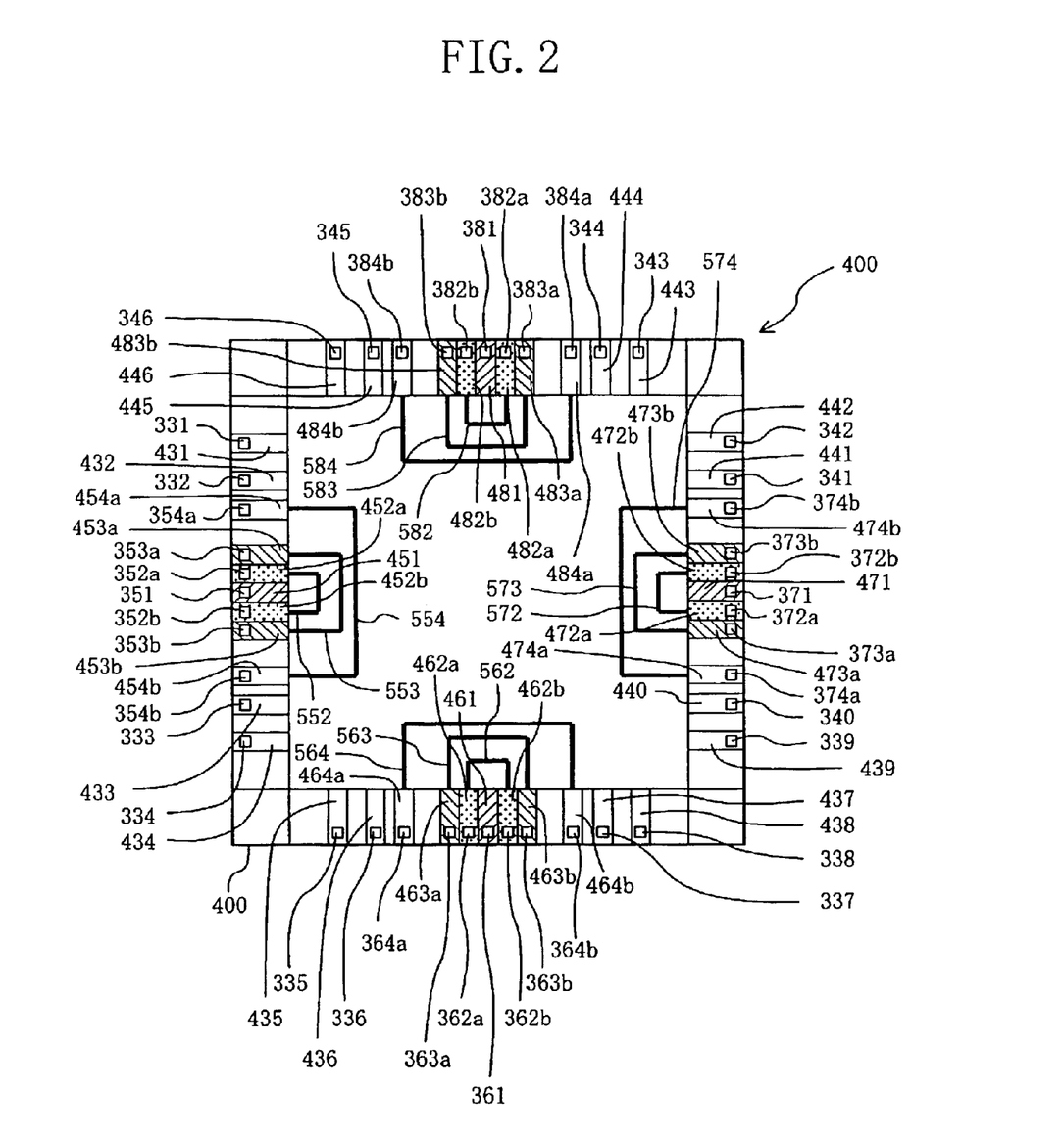
FIG. 2 shows a semiconductor integrated circuit device according to the embodiment of the present invention.
Figure 3:
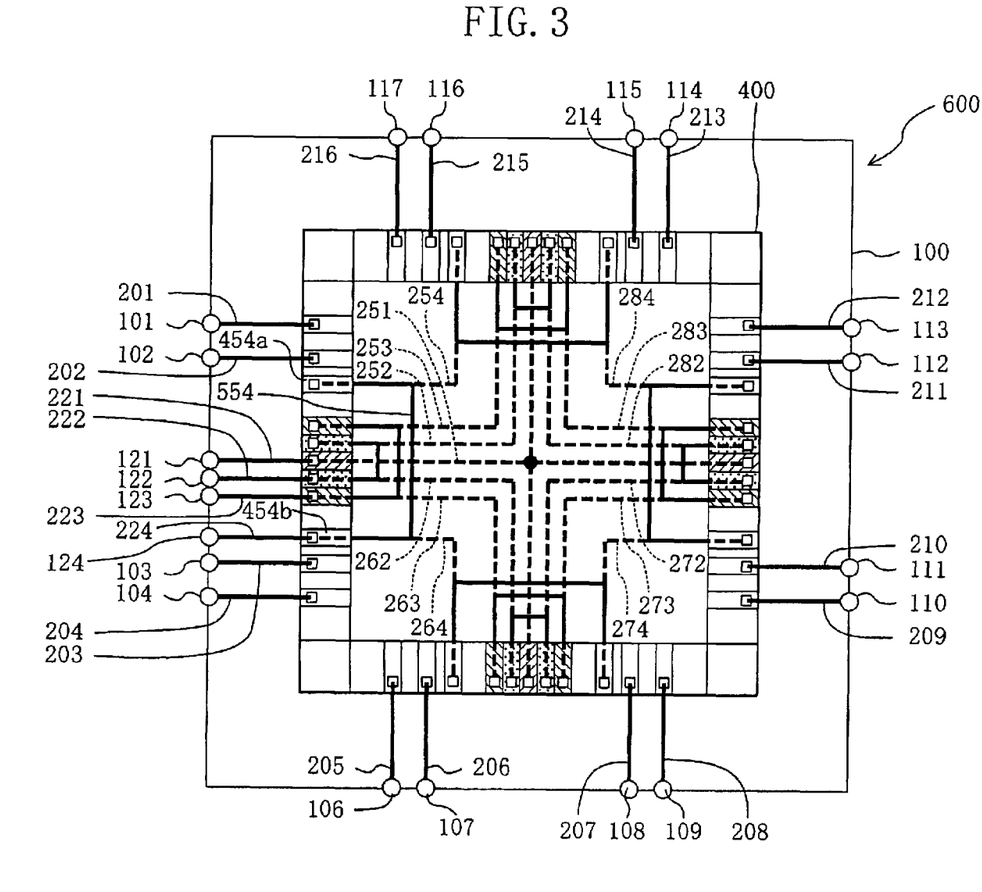
FIG. 3 shows a structure obtained when the semiconductor integrated circuit device of FIG. 2 is mounted on the mounting board of FIG. 1 in the present embodiment.

FIG. 1 shows a mounting board according to the embodiment of the present invention. FIG. 2 shows a semiconductor integrated circuit device according to the present embodiment. FIG. 3 shows a structure obtained when the semiconductor integrated circuit device of FIG. 2 is mounted on the mounting board of FIG. 1 in the present embodiment.

As shown in FIG. 1, a mounting board 100 comprises: a board 100a having a rectangular mounting region M for mounting thereon an IC device; signal terminals 101 to 116 provided on the individual edge portions of the board 100a; power supply terminals 121 to 124 also provided on the individual edge portions of the board 100a; electrodes 131 to 146, 151, 152a, 152b, 153a, 153b, 154a, 154b, 161, 162a, 162b, 163a, 163b, 164a, 164b, 171, 172a, 172b, 173a, 173b, 174a, 174b, 181, 182a, 182b, 183a, 183b, 184a, and 184b provided on the individual edge portions of the mounting region M for connection with the IC device; signal lines 201 to 216; and power supply lines 221 to 224, 251 to 254, 262 to 264, 272 to 274, and 282 to 284.

Each of the signal terminals 101 to 116, the power supply terminals 121 to 124, the electrodes 131 to 146, 151, 152a, 152b, 153a, 153b, 154a, 154b, 161, 162a, 162b, 163a, 163b, 164a, 164b, 171, 172a, 172b, 173a, 173b, 174a, 174b, 181, 182a, 183a, 183b, 184a, and 184b for connection with the semiconductor integrated circuit device, the signal lines 201 to 216, the power supply lines 221 to 224, 251 to 254, 262 to 264, 272 to 274, and 282 to 284 is provided on the board 100a.

The power supply terminals 121 to 124 are connected to the electrodes 151, 152b, 153b, and 154b by the power supply lines 221 to 224, respectively.

The electrode 151 is connected to each of the electrodes 161, 171, and 181 by the power supply line 251.

The electrodes 152a, 153a, and 154a are connected to the electrodes 182b, 183b, and 184b by the power supply lines 252, 253, and 254, respectively.

The electrodes 152b, 153b, and 154b are connected to the electrodes 162a, 163a, and 164a by the power supply lines 262, 263, and 264, respectively.

The electrodes 162b, 163b, and 164b are connected to the electrodes 172a, 173a, and 174a by the power supply lines 272, 273, and 274, respectively.

The electrodes 172b, 173b, and 174b are connected to the electrodes 182a, 183a, and 184a by the power supply lines 282, 283, and 284, respectively.

A description will be given next to a semiconductor integrated circuit device (hereinafter referred to as the IC device) 400 used in the present embodiment.

As shown in FIG. 2, the IC device 400 comprises: signal terminal cells 431 to 446 provided on the individual edge portions thereof; power supply terminal cells 451, 452a, 452b, 453a, 453b, 454a, 454b, 461, 462a, 462b, 463a, 463b, 464a, 464b, 471, 472a, 472b, 473a, 473b, 474a, 474b, 481, 482a, 482b, 483a, 483b, 484a, and 484b also provided on the individual edge portions; and metal lines 552 to 554, 562 to 564, 572 to 574, and 582 to 584.

The signal terminal cells 431 to 446 are provided with respective electrodes 331 to 346 for providing a connection between the inside and outside of the IC device 400.

The power supply terminal cells 451, 452a, 452b, 453a, 453b, 454a, 454b, 461, 462a, 462b, 463a, 463b, 464a, 464b, 471, 472a, 472b, 473a, 473b, 474a, 474b, 481, 482a, 482b, 483a, 483b, 484a, and 484b are provided with respective electrodes 351, 352a, 352b, 353a, 353b, 354a, 354b, 361, 362a, 362b, 363a, 363b, 364a, 364b, 371, 372a, 372b, 373a, 373b, 374a, 374b, 381, 382a, 382b, 383a, 383b, 384a, and 384b for providing a connection between the inside and outside of the IC device 400.

The metal lines 552 to 554 provide connections between the power supply terminal cells 352a and 352b, the power supply terminal cells 353a and 353b, and the power supply terminal cells 354a and 354b, respectively.

The metal lines 562 to 564 provide connections between the power supply terminal cells 362a and 362b, the power supply terminal cells 363a and 363b, and the power supply terminal cells 364a, and 364b, respectively.

The metal lines 572 to 574 provide connections between the power supply terminal cells 372a and 372b, the power supply terminal cells 373a and 373b, and the power supply terminal cells 374a and 374b, respectively.

The metal lines 582 to 584 provide connections between the power supply terminal cells 382a and 382b, the power supply terminal cells 383a and 383b, and the power supply terminal cells 384a and 384b, respectively.

A description will be given next to a device and board assembly 600 composed of the IC device 400 mounted on the mounting region M of the mounting board 100 with reference to FIG. 3.

In the device and board assembly 600 composed of the IC device 400 mounted on the mounting board 100, the electrode 331 is connected to the electrode 131 on the mounting board 100, as shown in FIG. 3. Likewise, the electrodes 332, 333, 334, 335, 336, 337, 338, and 339 are connected to the electrodes 132, 133, 134, 135, 136, 137, 138, and 139, respectively. The electrodes 340, 341, 342, 343, 344, 345, and 346 are connected to the electrodes 140, 141, 142, 143, 144, 145, and 146, respectively. The electrodes 351, 352a, 352b, 353a, 353b, 354a, and 354b are connected to the electrodes 151, 152a, 152b, 153a, 153b, 154a, and 154b, respectively. The electrodes 361, 362a, 362b, 363a, 363b, 364a, and 364b are connected to the electrodes 161, 162a, 162b, 163a, 163b, 164a, and 164b, respectively. The electrodes 371, 372a, 372b, 373a, 373b, 374a, and 374b are connected to the electrodes 171, 172a, 172b, 173a, 173b, 174a, and 174b, respectively. The electrodes 381, 382a, 382b, 383a, 383b, 384a, and 384b are connected to the electrodes 181, 182a, 182b, 183a, 183b, 184a, and 184b, respectively.

The operation of the device and board assembly 600 thus constructed according to the present embodiment will be described with reference to FIGS. 1 to 3.

If the power supply voltage is applied to the power supply terminal 121 provided on the mounting board 100, the power supply voltage is supplied to the electrodes 151, 161, 171, and 181 disposed on the mounting board 100 through the power supply line 221 formed on the mounting board 100. Then, the power supply voltage is supplied from the electrodes 151, 161, 171, and 181 to the electrodes 351, 361, 371, and 381 provided on the power supply terminal cells 451, 461, 471, and 481 of the IC device 400, respectively, whereby the power supply voltage is supplied to the inside of the IC device 400.

The power supply voltage applied to the power supply terminals 122, 123, and 124 is supplied to the electrodes 152b, 153b, and 154b disposed on the mounting board 100 and to the electrodes 162a, 163a, and 164a also disposed on the mounting board 100 through the power supply lines 222, 223, and 224, respectively.

Subsequently, the power supply voltage is supplied from the electrodes 152b, 153b, and 154b to the electrodes 352b, 353b, and 354b provided on the power supply terminal cells 452b, 453b, and 454b of the IC device 400, whereby the power supply voltage is supplied to the inside of the IC device 400.

Next, the power supply voltage supplied to the electrodes 352b, 353b, and 354b provided on the power supply terminal cells 452b, 453b, and 454b of the IC device 400 is supplied to the power supply terminal cells 452a, 453a, and 454a provided with the power supply terminal cell 451 interposed between themselves and the electrodes 352b, 353b, and 354b through the metal lines 552, 553, and 554, respectively. Then, the power supply voltage supplied to the power supply terminal cells 452a, 453a, and 454a is supplied to the electrodes 152a, 153a, and 154a disposed on the mounting board 100 via the electrodes 352a, 353a, and 354a formed on the power supply terminal cells 452a, 453a, and 454a, respectively.

Next, the power supply voltage supplied to the electrodes 152a, 153a, and 154a is supplied to the electrodes 182b, 183b, and 184b through the power supply lines 252, 253, and 254, respectively. Subsequently, the power supply voltage is supplied to the electrodes 382b, 383b, and 384b provided on the power supply terminal cells 482b, 483b, and 484b of the IC device 400 via the electrodes 182b, 183b, and 184b, respectively, whereby the power supply voltage is supplied to the inside of the IC device 400.

Next, the power supply voltage supplied to the electrodes 382b, 383b, and 384b is supplied to the power supply terminal cells 482a, 483a, and 484a provided with the power supply terminal cell 481 interposed between themselves and the electrodes 382b, 383b, and 384b through the metal lines 582, 583, and 584, respectively. Then, the power supply voltage supplied to the power supply terminal cells 482a, 483a, and 484a is supplied to the electrodes 182a, 183a, and 184a disposed on the mounting board 100 via the electrodes 382a, 383a, and 384a formed on the power supply terminal cells 482a, 483a, and 484a, respectively.

Next, the power supply voltage supplied to the electrodes 182a, 183a, and 184a is supplied to the electrodes 172b, 173b, and 174b through the power supply lines 282, 283, and 284, respectively. Subsequently, the power supply voltage is supplied to the electrodes 372b, 373b, and 374b provided on the power supply terminal cells 472b, 473b, and 474b of the IC device 400 via the electrodes 172b, 173b, and 174b, respectively, whereby the power supply voltage is supplied to the inside of the IC device 400.

Next, the power supply voltage supplied to the electrodes 372b, 373b, and 374b is supplied to the power supply terminal cells 472a, 473a, and 474a provided with the power supply terminal cell 471 interposed between themselves and the electrodes 372b, 373b, and 374b through the metal lines 572, 573, and 574, respectively. Then, the power supply voltage supplied to the power supply terminal cells 472a, 473a, and 474a is supplied to the electrodes 172a, 173a, and 174a disposed on the mounting board 100 via the electrodes 372a, 373a, and 374a, formed on the power supply terminal cells 472a, 473a, and 474a, respectively.

Next, the power supply voltage supplied to the electrodes 172a, 173a, and 174a is supplied to the electrodes 162b, 163b, and 164b through the power supply lines 272, 273, and 274, respectively. Subsequently, the power supply voltage is supplied to the electrodes 362b, 363b, and 364b provided on the power supply terminal cells 462b, 463b, and 464b of the IC device 400 via the electrodes 162b, 163b, and 164b, respectively, whereby the power supply voltage is supplied to the inside of the IC device 400.

Next, the power supply voltage supplied to the electrodes 362b, 363b, and 364b is supplied to the power supply terminal cells 462a, 463a, and 464a provided with the power supply terminal cell 461 interposed between themselves and the electrodes 362b, 363b, and 364b through the metal lines 562, 563, and 564, respectively. Then, the power supply voltage supplied to the power supply terminal cells 462a, 463a, and 464a is supplied to the electrodes 162a, 163a, and 164a disposed on the mounting board 100 via the electrodes 362a, 363a, and 364a formed on the power supply terminal cells 462a, 463a, and 464a, respectively.

In short, when the power supply voltage is applied, potentials equal to the power supply voltage are achieved at all the power supply terminal cells.

According to the present embodiment, the lines which achieve equal potentials at the individual power supply terminal cells, i.e., the lines (lines 552 to 554, 562 to 564, 572 to 574, and 583 to 584) each providing a connection between the corresponding one of the plurality of pairs of power supply terminal cells in the IC device 400 are provided within the IC device 400. This allows mounting of the IC device 400 which should supply each of different voltages obtained from different power supplies to each of the plurality of edge portions of the single-layer mounting board 100.

Preferably, the lines (lines 552 to 554, 562 to 564, 572 to 574, and 583 to 584) each providing a connection between the corresponding one of the plurality of pairs of power supply terminal cells in the IC device 400 are composed of a material having a lowest resistance of all the materials composing the IC device 400. This minimizes a voltage drop in at least one of the lines provided in the IC device 400.

The wiring length in the IC device 400 is reduced preferably by minimizing the distances between the power supply terminal cells connected in pairs by the lines based on design rules for fabricating the IC device 400, as in the present embodiment. This minimizes a voltage drop in at least one of the lines provided in the IC device 400.

Although the IC device 400 according to the present embodiment is provided with four types of power supply terminal cells, it is not limited thereto. A maximum permissible number of power supply terminal cells determined by the respective lengths of the edges of the IC device 400 can be provided on the individual edge portions. As a result, the types of power supply terminals can be increased substantially without limitation by elongating the individual edge portions of the IC device 400 so that the circuit is designed with extremely high flexibility.

By further providing signal terminal cells externally of power supply terminal cells which are connected in pairs by lines as in the IC device 400 according to the present embodiment, separation is achieved between a region provided with the signal lines and a region provided with the power supply lines in the IC device 400. This suppresses the degradation of signals and a power supply voltage induced by noise.

Since the mounting board 100 according to the present embodiment can be separated into a region provided with the signal lines and a region provided with the power supply lines, the degradation of the signals and the power supply voltage induced by noise can be suppressed.

Although the mounting board 100 according to the present embodiment is provided with the foul types of power supply lines, it is not limited thereto. The number of power supply lines can be maximized within the limits imposed by the area of the mounting surface of the IC device 400. This significantly relaxes restrictions on the design of the mounting board.

Alternatively, the power supply terminal cells provided on the IC device 400 according to the present embodiment may also be replaced with terminals each performing a buffer operation or terminals composing a regulator generating a desired voltage from a reference power supply or the like.

Although the metal lines have been used as means for providing connections between the power supply terminals and the electrodes, a conductive material other than metal may also be used.

Although the present embodiment has used the metal lines as means for providing connections between the individual power supply terminal cells formed on the IC device 400, a conductive material other than metal may also be used.

Although the present embodiment has particularly described the method in which the power supply voltage is supplied from the individual edge portions of the IC device 400, arbitrary signals may also be inputted and outputted instead of the power supply voltage.

According to the present invention, there is provided a mounting board which is low in fabrication cost and a semiconductor integrated device to be mounted on the mounting board.

What is claimed is:

1. A semiconductor integrated circuit device comprising:
   a semiconductor chip formed with a semiconductor integrated circuit;
   at least one pair of previous-stage power supply terminals provided on the semiconductor chip and connected to a power supply line;
   a plurality of pairs of subsequent-stage power supply terminals provided on the semiconductor chip and connected to the power supply line connected commonly to the at least one pair of previous-stage power supply terminals;
   at least one previous-stage line providing a connection between the at least one pair of previous-stage power supply terminals;
   subsequent-stage lines equal in number to the plurality of pairs of subsequent-stage power supply terminals and each providing a connection between the corresponding one of the plurality of pairs of subsequent-stage power supply terminals;

a previous-stage center power supply terminal disposed between the at least one pair of previous-stage power supply terminals and connected to a power supply line other than the foregoing power supply line; and a plurality of subsequent-stage center power supply terminals each disposed between the corresponding one of the plurality of pairs of subsequent-stage power supply terminals and connected to the power supply line connected commonly to the previous-stage center power supply terminal, the at least one pair of previous-stage power supply terminals and the plurality of pairs of subsequent-stage power supply terminals being connected to each other to form a closed circuit when they are mounted on a mounting board, and the previous-stage center power supply terminal and the plurality of subsequent-stage center power supply terminals being connected to each other when they are mounted on the mounting board.

2. The device of claim 1, wherein the pairs of previous-stage and subsequent-stage power supply terminals are positioned such that respective minimum distances are provided between the at least one pair of previous-stage power supply terminals and between each of the plurality of pairs of subsequent-stage power supply terminals.

3. The device of claim 1, wherein the previous-stage center power supply terminal is connected to a first power supply line, the at least one pair of previous-stage power supply terminals is composed of a plurality of second to N-th pairs connected to second to N-th power supply lines, and the plurality of pairs of subsequent-stage power supply terminals are composed of a plurality of second to N-th pairs connected to the second to N-th power supply lines.

4. The device of claim 3, further comprising:

at least one signal terminal provided eternally of the at least one pair of previous-stage power supply terminals or the plurality of pairs of subsequent-stage power supply terminals.

5. A device and board assembly comprising:

a semiconductor integrated circuit device comprising a semiconductor chip formed with a semiconductor integrated circuit, at least one pair of previous-stage power supply terminals provided on the semiconductor chip and connected to a power supply line, a plurality of pairs of subsequent-stage power supply terminals provided on the semiconductor chip and connected to the power supply line connected commonly to the at least one pair of previous-stage power supply terminals, at least one previous-stage line providing a connection between the at least one pair of the previous-stage power supply terminals, subsequent-stage lines equal in number to the plurality of pairs of subsequent-stage power supply terminals and each providing a connection between the corresponding one of the plurality of pairs of subsequent-stage power supply terminals, a previous-stage center power supply terminal disposed between the at least one pair of previous-stage power supply terminals and connected to a power supply line other than the foregoing power supply line, and a plurality of subsequent-stage center power supply terminals each disposed between the corresponding one of the plurality of pairs of subsequent-stage power supply terminals and connected to the power supply line connected commonly to the previous-stage center power supply terminal; and a mounting board comprising a board having a mounting region for mounting thereon a semiconductor integrated circuit device, at least one pair of previous-stage power supply input electrodes disposed within the mounting region and connected to the at least one pair of previous-stage power supply terminals, a plurality of pairs of subsequent-stage power supply input electrodes disposed within the mounting region and connected to the plurality of respective pairs of subsequent-stage power supply terminals, and a line for connecting the at least one pair of previous-stage power supply input electrodes and the plurality of pairs of subsequent-stage power supply input electrodes to each other, the semiconductor integrated circuit device being mounted on the mounting region, and the previous-stage center power supply terminal and the plurality of subsequent-stage center power supply terminals being connected to each other.

6. The device of claim 5, wherein the pairs of previous-stage and subsequent-stage power supply terminals are positioned such that respective minimum distances are provided between the at least one pair of previous-stage power supply terminals and between each of the plurality of pairs of subsequent-stage power supply terminals.

* * * * *

UNITED STATES PATENT AND TRADEMARK OFFICE
CERTIFICATE OF CORRECTION

PATENT NO. : 6,841,864 B2
DATED : January 11, 2005
INVENTOR(S) : Takeshi Hirayama It is certified that error appears in the above-identified patent and that said Letters Patent is hereby corrected as shown below:

Column 12,
Line 48, add old claims 12 and 13 as claims 7 and 8 as follows:

7. The device of claim 5, wherein
the previous-stage center power supply terminal is connected to a first power supply line,
the at least one pair of previous-stage power supply terminals is composed of a plurality of second to N-th pairs connected to second to N-th power supply lines, and the plurality of pairs of subsequent-stage power supply terminals are composed of a plurality of second to N-th pairs connected to the second to N-th power supply lines.

8. The device of claim 7, further comprising:
at least one signal terminal provided eternally of the at least one pair of previous-stage power supply terminals or the plurality of pairs of subsequent-stage power supply terminals.

Signed and Sealed this

Twenty-fourth Day of May, 2005

JON W. DUDAS
*Director of the United States Patent and Trademark Office*